US006815966B1

(12) United States Patent
Gunn et al.

(10) Patent No.: US 6,815,966 B1
(45) Date of Patent: Nov. 9, 2004

(54) SYSTEM FOR BURN-IN TESTING OF ELECTRONIC DEVICES

(75) Inventors: Bradley R. Gunn, Fremont, CA (US); Alberto J. Calderon, San Jose, CA (US); Jovan Jovanovic, Santa Clara, CA (US); David S. Hendrickson, Los Gatos, CA (US)

(73) Assignee: Aehr Test Systems, Fremont, CA (US)

( * ) Notice: Subject to any disclaimer, the term of this patent is extended or adjusted under 35 U.S.C. 154(b) by 0 days.

(21) Appl. No.: 10/184,525

(22) Filed: Jun. 27, 2002

(51) Int. Cl.[7] .............................................. G01R 31/02
(52) U.S. Cl. ...................................................... 324/760
(58) Field of Search ................................ 324/760, 765, 324/158.1

(56) References Cited

U.S. PATENT DOCUMENTS

| 4,145,620 A | | 3/1979 | Dice | |
|---|---|---|---|---|
| 4,374,317 A | | 2/1983 | Bradshaw | |
| 4,432,604 A | * | 2/1984 | Schwab | 439/65 |
| 4,777,434 A | * | 10/1988 | Miller et al. | 324/757 |
| 4,924,179 A | * | 5/1990 | Sherman | 324/755 |
| 4,998,180 A | * | 3/1991 | McAuliffe et al. | 361/684 |
| 5,103,168 A | * | 4/1992 | Fuoco | 324/760 |
| 5,200,885 A | * | 4/1993 | Hamilton et al. | 439/61 |
| 5,329,093 A | * | 7/1994 | Okano | 324/537 |
| 5,429,510 A | * | 7/1995 | Barraclough et al. | 439/59 |
| 5,825,171 A | * | 10/1998 | Shin | 324/760 |
| 6,181,146 B1 | * | 1/2001 | Koyama | 324/760 |
| 6,340,895 B1 | | 1/2002 | Uher et al. | |
| 6,562,636 B1 | | 5/2003 | Richmond, II et al. | |

FOREIGN PATENT DOCUMENTS

| DE | 19962868 A | 8/2000 |
|---|---|---|
| WO | WO 01/04641 A | 1/2001 |

OTHER PUBLICATIONS

PCT International Search Report for PCT Application No. PCT/US03/20332, mailed Oct. 30, 2003 (8 pages).

* cited by examiner

Primary Examiner—Kamand Cuneo
Assistant Examiner—Jermele Hollington
(74) Attorney, Agent, or Firm—Blakely, Sokoloff, Taylor & Zafman; Stephen M. De Klerk

(57) ABSTRACT

A system is provided which allows for burn-in testing of electronic devices wherein power current is provided individually to each one of the electronic devices. The system also includes various connectors, cables, and other configurations that allow for power currents having large magnitudes to be provided to the electronic devices.

26 Claims, 6 Drawing Sheets

SYSTEM FOR BURN-IN TESTING OF ELECTRONIC DEVICES

BACKGROUND OF THE INVENTION

1). Field of the Invention

This invention relates generally to a system for burn-in testing of electronic devices.

2). Discussion of Related Art

When fabrication of electronic devices, such as computer processors and memories, has been completed, the electronic devices are subjected to burn-in and electrical tests in order to identify and eliminate defective devices before shipment to customers. The term "burn-in" relates to operation of an integrated circuit at a predetermined temperature or temperature profile, typically an elevated temperature in an oven. Certain operating electrical bias levels and/or signals are supplied to the electronic devices while they are at the elevated temperature. The use of the elevated temperature accelerates stress to which the devices are subjected during burn-in, so that marginal devices that would otherwise fail shortly after being placed in service fail during burn-in, and are eliminated before shipping.

The electronic devices are usually located within burn-in sockets that are mounted to a burn-in board substrate. The burn-in board substrate is then inserted into an oven, and edge fingers on the burn-in board substrate are inserted into an edge finger socket in a rear of the oven. A driver board assembly is located externally of the oven, and is connected to the edge finger socket on a feedthrough board. Signal currents are provided from the driver board assembly through the feedthrough board, the edge finger socket on the feedthrough board, and the edge fingers to the electronic devices in the sockets on the burn-in board substrate. Power current is also provided from the driver board assembly through the socket and the edge fingers to the electronic devices.

The magnitude of the power that can be provided through edge fingers is generally relatively small, typically on the order of 3 to 5 A per finger. Certain devices, for example, computer processors, now require power currents having larger magnitudes than what can practically be achieved through edge finger connectors. In many cases, it may also be required to monitor power current that is provided to each individual device. Existing systems, however, are not adapted for providing individual power current to individual devices, and therefore also do not lend themselves to monitoring of power currents that are provided individually to each electronic device per finger.

Another disadvantage of using edge finger connectors is that they can only be located on an edge of a substrate, and therefore provide a limited amount of real estate for adding additional signal, power, ground, and other lines.

BRIEF SUMMARY OF THE INVENTION

Generally speaking, a system is provided which allows for burn-in testing of electronic devices wherein power current is provided individually to each one of the electronic devices. The system also includes various connectors, cables, and other configurations that allow for power currents having large magnitudes to be provided to the electronic devices.

According to one aspect of the invention, a burn-in board assembly is provided. The burn-in board assembly has a burn-in board substrate, a plurality of burn-in sockets on the burn-in board substrate, each to receive a respective electronic device. The burn-in board assembly also has a plurality of burn-in board signal connectors on the burn-in board substrate. Each burn-in board signal connector has a surface for releasably mating with a respective surface of a respective signal contact. Each signal connector is capable of carrying maximum direct current having a first magnitude. (Direct-current ratings are used throughout this description, although it should be understood that the connectors that are so characterized herein may carry direct current or alternating current.) The burn-in board assembly also has a plurality of burn-in board signal conductors. Each signal conductor connects the burn-in board signal connectors to signal contacts on the devices. The burn-in board assembly also has a plurality of burn-in board power connectors secured to the burn-in board substrate. Each burn-in board power connector has a surface for releasably mating with a respective surface of a respective power contact. Each power connector is capable of carrying maximum direct current having a second magnitude which is larger than the first magnitude. The burn-in board assembly also has a plurality of burn-in board power conductors. Each burn-in board power conductor connects each burn-in board power connector individually to a respective burn-in board power contact on a respective one of the devices.

The second magnitude may be at least 7 A. The second magnitude may be at least 1.5 times the first magnitude. The second magnitude may be at least 4 A more than the first magnitude.

The burn-in board power conductors are preferably capable of carrying maximum direct current of a magnitude which is larger than the first magnitude.

Burn-in board power conductors preferably connect at least five of the burn-in board power connectors individually to at least five of the devices. More preferably, the burn-in board power conductors connect at least 10 of the burn-in board power connectors individually to at least 10 of the devices.

The burn-in board signal connectors and the burn-in board power connectors may be different types of connectors. The burn-in board signal connectors may, for example, be edge fingers. The surface of each burn-in board power connector may, for example, be cyndrical, preferably circular cylindrical, such as when the burn-in power connector is a respective pin.

The burn-in board signal connectors and the burn-in board power connectors may be in two distinct groups. The burn-in board assembly may, for example, include a burn-in board power connector block with the burn-in board power connector secured to the burn-in board power block, and the burn-in board power connector block being secured to the burn-in board substrate independent from the burn-in board signal connectors. The burn-in board assembly may also include a burn-in board daughter card, with the burn-in board power connector being secured to the burn-in board daughter card, and the burn-in board daughter card being secured to the substrate independent from the burn-in board signal connectors. Portions of the burn-in board power conductors may form traces, the traces spreading from one another from the burn-in board power connectors to locations where the burn-in board power conductors leave the burn-in board daughter card. The traces may spread by at least 25%.

Preferably, movement of the burn-in board substrate in an insertion direction causes engagement of the burn-in board signal connectors with the signal contacts and engagement of the burn-in board power connectors with the power contacts. In such a case, the burn-in board power connectors may be pins, and the burn-in board signal connectors may be edge fingers.

Preferably, the signal contacts are at the same locations on at least two of the devices, and the power contacts are at the same locations on the two devices.

According to another aspect of the invention, a burn-in board assembly is provided, having different types of connectors. A plurality of burn-in board signal edge finger connectors and a plurality of burn-in board power conductors may be secured to a burn-in board substrate, wherein each burn-in board power conductor has a cylindrical contact surface. The cylindrical contact surface may, for example, be circular cylindrical. In one embodiment, the burn-in board power conductors may be pins. An embodiment is also contemplated wherein the burn-in board power conductors are holes that mate with pins, but such an embodiment has the disadvantage that the pins cannot be maintained as easily as when they are located on the burn-in board substrate.

According to another aspect of the invention, a burn-in testing driver assembly is provided. The burn-in testing driver assembly includes a driver substrate, a plurality of driver signal connectors secured to the driver substrate, signal electronics, a plurality of driver power connectors secured to the driver substrate, and a power supply. Each driver signal connector has a surface for releasably mating with a respective signal contact. Each driver signal connector is also capable of carrying a maximum direct current having a first magnitude. Each driver power connector has a surface for releasably mating with a respective power contact. Each driver power connector is also capable of carrying maximum direct current having a second magnitude which is larger than the first magnitude. The power supply is connected to the driver power connectors.

The second magnitude may, for example, be at least 7 A. The second magnitude may, for example, be at least 1.5 times the first magnitude. The second magnitude may, for example, be at least 4 A more than the first magnitude.

The driver signal connectors and the driver power connectors may be different types of connectors. The driver signal connectors may, for example, be within an edge finger connector block. The surface of each driver power connector may, for example, be substantially circular, such as in the case where each driver power connector is a respective pin.

The driver signal connectors and the driver power connectors may be in two distinct groups. The burn-in testing driver may, for example, further include a driver power connector block, with the driver power connectors being secured to the driver power connector block, and the driver power connector block being secured to the driver substrate independent from the driver signal connectors. The burn-in testing driver may, for example, further include a driver power board, with the driver power connector being secured to the driver power board, and the driver power board being secured to the driver substrate independent from the driver signal connectors.

Preferably, movement of the driver substrate in an insertion direction causes engagement of the driver signal connectors with the signal contacts and engagement of the driver power connectors with the power contacts.

The burn-in testing driver may further include a plurality of driver current detectors and an output device. Each detector may be in communication with a respective one of the driver power connectors to detect current separately through each one of the driver power connectors. The output device may be in communication with the driver current detectors to provide an output of the respective currents through the respective driver power connectors.

According to a further aspect of the invention, a burn-in testing driver assembly is provided, having a driver substrate, a plurality of driver signal connectors, signal electronics, a plurality of driver power connectors, a power supply, a plurality of driver current detectors, and an output device. The driver signal connectors are secured to the driver substrate. Each driver signal connector has a surface for releasably mating with a respective signal contact. The signal electronics is connected to the driver signal connectors. The driver power connectors are secured to the driver substrate. Each driver power connector has a surface for releasably mating with a respective power contact. The power supply is connected to the driver power connectors. Each detector is in communication with a respective one of the driver power connectors to detect current separately through each one of the driver power connectors. The output device is in communication with the driver current detectors to provide an output of the respective current through the respective driver connectors. The output device may, for example, be a microcontroller that provides an output indicative of the magnitudes of the respective currents to a computer.

Preferably, power current provided by the power supply to a plurality of the driver power connectors is shut down if a current detected by a single driver current detectors exceeds a predetermined maximum. Preferably, power current to at least 10 of the driver power connectors is shut down. Power current may be shut down by shutting down the power supply.

BRIEF DESCRIPTION OF THE DRAWINGS

The invention is further described by way of example with reference to the accompanying drawings, wherein.

DETAILED DESCRIPTION OF THE INVENTION

System Overview

Figure 1:
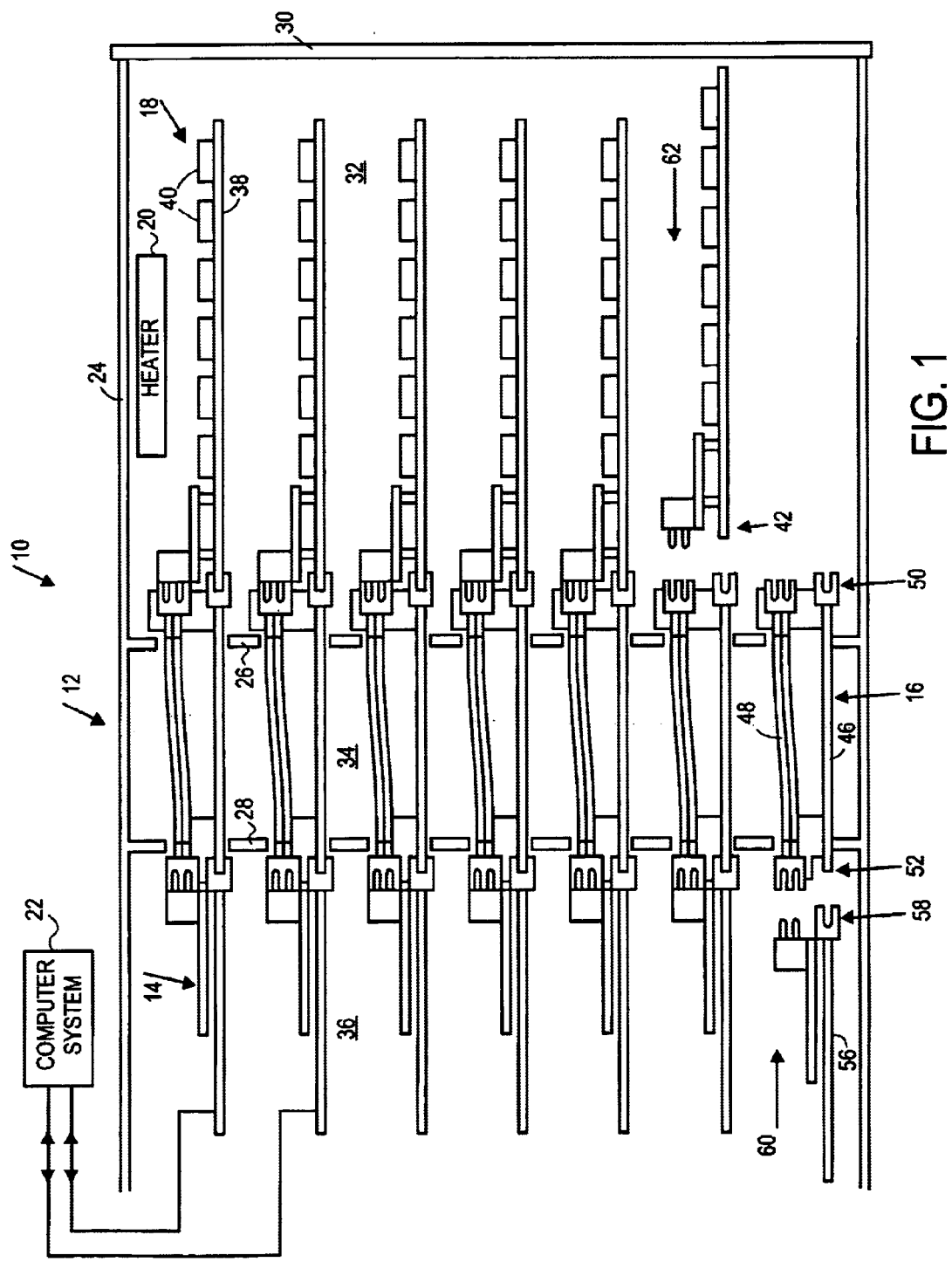
FIG. 1 is a side view illustrating a system, according to an embodiment of the invention, that is used for burn-in testing of electronic devices.

FIG. 1 of the accompanying drawings illustrates a system 10 that is used for burn-in testing of electronic devices, according to an embodiment of the invention. The system 10 includes a housing 12, a plurality of burn-in testing driver board assemblies 14, a plurality of feedthrough assemblies 16, a plurality of burn-in board assemblies 18, a heater 20, and a computer system 22.

The housing 12 has an outer wall 24, two inner walls 26 and 28, and a door 30. An oven area 32 is defined jointly by the inner wall 26, the door 30, and a portion of the outer wall 24. A wall cavity 34 is defined jointly by the inner walls 26 and 28 and another portion of the outer wall 24. A driver cabinet 36 is defined jointly by the inner wall 28 and another portion of the outer wall 24 on a side of the wall cavity 34 opposing the oven area 32.

Each burn-in board assembly 18 has a respective burn-in board substrate 38 and a plurality of burn-in sockets 40 mounted to the burn-in board substrate 38. Each burn-in socket 40 is capable of receiving a respective electronic device for purposes of burning in and/or testing the electronic device. Each burn-in board assembly 18 also has a respective electronic interface 42 on a left side thereof.

Each feedthrough assembly 16 has a respective feedthrough board 46, additional feedthrough cables 48 mounted to the feedthrough board 46, and opposing electronic interfaces 50 and 52. The feedthrough assemblies 16 are located within the wall cavity 34 and form a bridge between the oven area 32 and the driver cabinet 36. The electronic interfaces 50 are positioned on the right of the feedthrough assembly 16 in the oven area 32, and the electronic interfaces 52 are positioned on the left in the driver cabinet 36.

Each burn-in testing driver board assembly 14 has a respective driver board substrate 56 and electronics (not shown) mounted directly and indirectly to the driver board substrate 56. The electronics include signal, power, and ground electronics that can be used to test the electronic devices held by the burn-in sockets 40. Each driver board assembly 14 also has a respective electronic interface 58 on a right side thereof.

When assembling the system 10, each driver board assembly 14 is moved in an insertion direction 60 into the driver cabinet 36. The electronic interface 58 of each driver board assembly 14 mates with an electronic interface 52 of a respective feedthrough assembly 16. The feedthrough assemblies 16, together with the driver board assemblies 14 connected thereto, form a permanent or semi-permanent driver subsystem that is used for testing multiple sets of electronic devices that are subsequently received by the burn-in board assemblies 18.

The door 30 is then opened and any of the burn-in board assemblies 18 in the oven area 32 are removed from the oven area 32. A respective electronic device is then inserted into each one of the burn-in sockets 40. The burn-in board assemblies 18 are then again moved in an insertion direction 62 into the oven area 32. A respective electronic interface 42 of each burn-in board assembly 18 mates with an electronic interface 50 of a respective feedthrough assembly 16.

The heater 20 is then operated so that the oven area 32 heats to a temperature required for burning in and/or testing the electronic devices. The heater 20 is shown as being within the oven area 32 for purposes of simplicity, but in reality is located in a separate dedicated area that is in communication with the oven area 32. The electronics of the driver board assemblies 14 are insulated, and so are protected, by the wall cavity 34 from heat in the oven area 32. A computer system 22 is connected to each one of the driver board assemblies 14. The computer system 22 is used to operate the electronics of the driver board assemblies 14 so that the electronics of each driver board assembly 14 provides signal, current, and ground through a respective feedthrough assembly 16 and a respective burn-in board assembly 18 to the electronic devices held by the sockets 40 of the respective burn-in board assembly 18. The electronic devices are tested while simultaneously being stressed with heat from the heater 20 and while the performance of each electronic device is monitored by the computer system 22. Monitoring and pass/fail detection is done by circuitry on the driver board assembly 14, and these results are reported back to the computer system 22.

The burn-in board assemblies 18 are disengaged from the feedthrough assemblies 16 after burn-in testing is completed, and the electronic devices are replaced with a subsequent set of devices that have to be tested.

As will now be further described, the system 10 includes components that allow for power current to be provided individually to each one of the electronic devices mounted to the sockets 40 of a respective burn-in board assembly 18. The components that allow for power current to be provided individually to each electronic device further allow for monitoring of power current provided to each electronic device individually. The components also allow for currents having larger magnitudes to be provided to the electronic devices than would be possible without the components.

Burn-In Board Assembly

Figure 2:
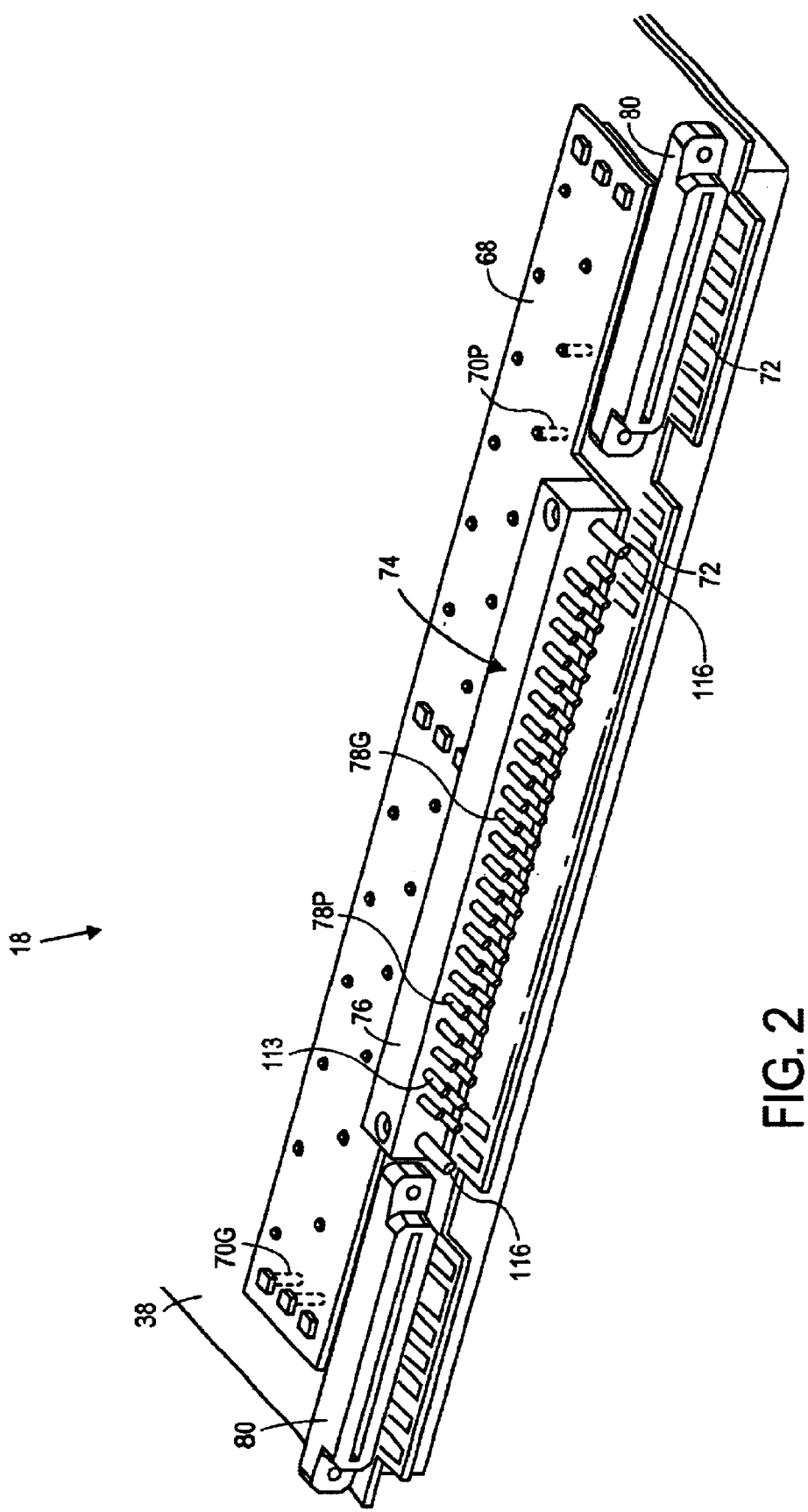
FIG. 2 is perspective view illustrating a portion of a burn-in board assembly forming part of the system.

FIG. 2 illustrates a portion of one of the burn-in board assemblies 18. The burn-in board assembly 18, in addition to the burn-in board substrate 38, further includes a burn-in board daughter card 68, 24 conductive power posts 70P, conductive ground posts 70G, burn-in board signal edge finger connectors 72, and a burn-in board power/ground connector 74.

Lower ends of the conductive power posts 70P are secured to the burn-in board substrate 38. The burn-in board daughter card 68 is secured to upper ends of the conductive power posts 70P, so that the burn-in board daughter card 68 is spaced from the burn-in board substrate 38.

The burn-in board power/ground connector 74 includes a burn-in board power/ground connector block 76 and 46 burn-in board conductor pins 78 secured to the burn-in board power/ground connector block 76. (There is, in fact, a $47^{th}$ pin, but it can be ignored for purposes of further discussion.) The 46 burn-in board conductor pins 78 include 24 burn-in board power conductor pins 78P and 22 burn-in board ground conductor pins 78G. The burn-in board conductor pins 78P and 78G all have circular cylindrical outer surfaces. The burn-in board power/ground connector block 76 is secured to an upper surface of the burn-in board daughter card 68. A spacing between a first and a last of the conductive power posts 70P is approximately twice a spacing between a first and a last of the burn-in board power conductor pins 78P.

The burn-in board signal edge finger connectors 72 are all located on upper and lower surfaces at an edge of the burn-in board substrate 38. The burn-in board signal edge finger connectors 72 can each carry a maximum direct current of either 3 A or 5 A. The burn-in board conductor pins 78P and 78G can carry maximum direct current of approximately 10 A each.

Edge finger socket blocks 80 may be mounted on opposing sides to the burn-in board substrate. The edge finger socket blocks 80, together with the edge finger connectors 72, can be used to form a high-density interconnect scheme such as that described in U.S. Pat. No. 5,429,510.

Figure 3:
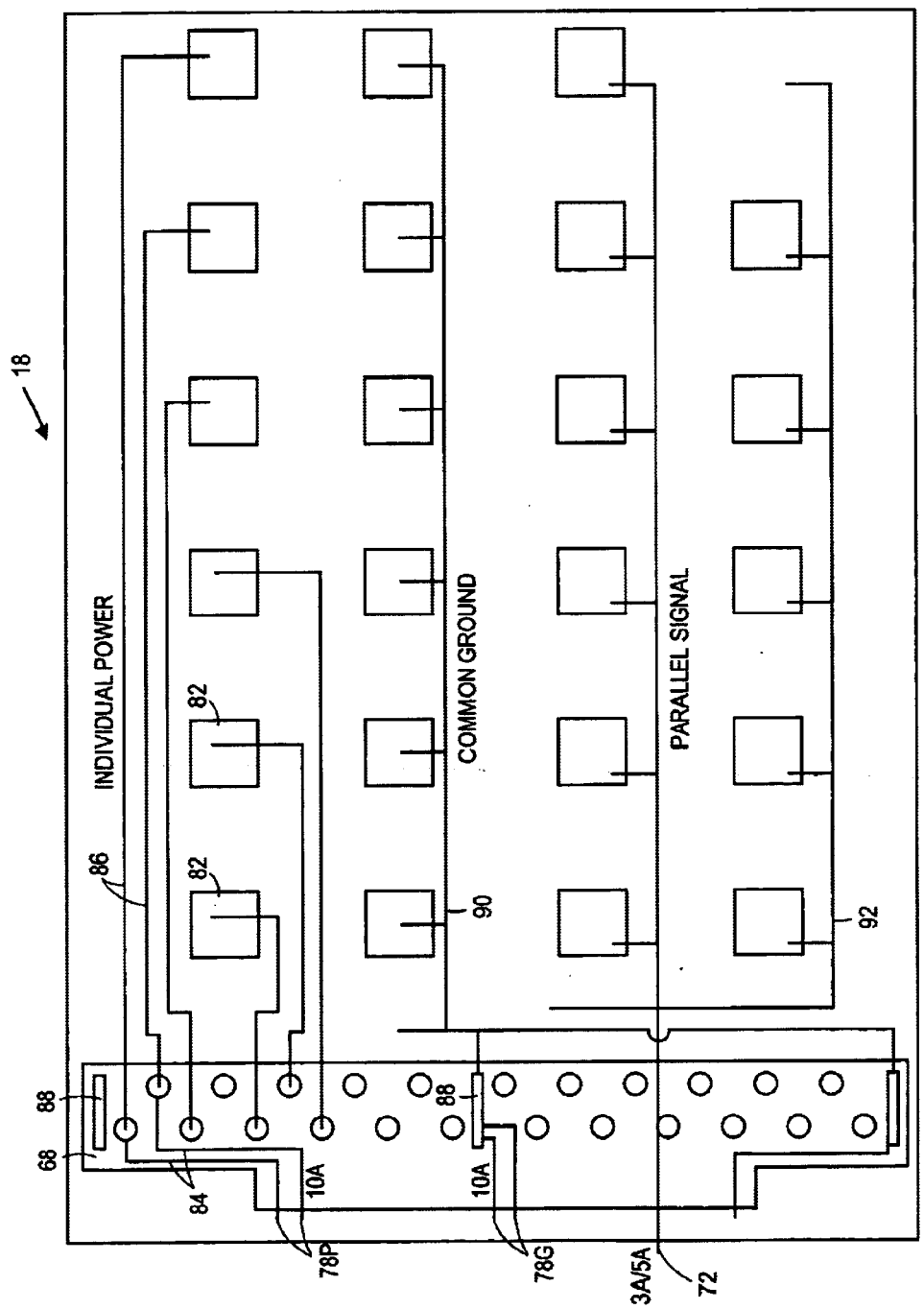
FIG. 3 is a top plan view illustrating further components of the burn-in board assembly.

FIG. 3 illustrates the burn-in board assembly 18 with, in the present example, 24 electronic devices 82 located thereon. The electronic devices 82, in the present example, are located in six columns at increased distances from the burn-in board daughter card 68, with four of the electronic devices 82 in each column.

Power traces 84 are formed on the burn-in board daughter card 68. Each trace 84 connects a respective burn-in board power conductor pin 78P to a respective conductive power post 70P. The traces 84 spread from where current enters the burn-in board daughter card 68 at the burn-in board power conductor pins 78P to where current leaves the burn-in board daughter card 68 at the conductive power posts 70P.

Respective power traces 86 are formed in the burn-in board substrate 38. Each one of the traces 86 connects a respective one of the conductive power posts 70P to a respective power contact of a respective one of the electronic devices 82. Because power current is provided independently to each one of the electronic devices 82, there is a total of 24 of the traces 86, each trace 86 connecting a respective post 70 to a respective electronic device 82. The spreading of the current as facilitated by the traces 84 reduces the requirement for many power planes to accommodate the relatively large number of traces 86.

What should be noted is that each one of the burn-in board power conductor pins 78P provides independent power individually to a respective one of the electronic devices 82 through a respective burn-in board power conductor formed by a respective one of the traces 84, a respective one of the conductive power posts 70P, and a respective one of the traces 86. There is a one-to-one relationship between the number of burn-in board power conductor pins 78P and the number of electronic devices 82. Each respective burn-in board power conductor can carry a maximum direct current of 10 A to a respective one of the electronic devices 82.

It can thus be seen that the burn-in board power conductor pins 78P allow for bypassing of the limited current-carrying capabilities of the burn-in board signal edge finger connectors 72. The burn-in board signal edge finger connectors 72 can thus each carry a maximum direct current having a first magnitude, and each burn-in board power conductor 78P can carry a maximum direct current having a second magnitude, the second magnitude being higher than the first magnitude. In another embodiment, the second magnitude may be at least 7 A. The second magnitude may be at least 1.5 times the first magnitude. The second magnitude may be at least 4 A more than the first magnitude.

Three ground shunt bars 88 are formed at spaced locations along the width of the burn-in board daughter card 68. Each one of the 22 burn-in board ground conductor pins 78G is connected to one of the ground shunt bars 88. Each ground shunt bar 88 is connected to a plurality of conductive ground posts 70G (FIG. 2). Ground traces 90 are formed in the burn-in board substrate 38, and are all connected to the conductive ground posts 70G. The traces 90 are also connected to one another, so that the burn-in board ground conductor pins 78G form a common terminal. The traces 90 are also connected to ground contacts on each one of the electronic devices 82.

Signal traces 92 in the burn-in board substrate 38 connect a respective one of the burn-in board signal edge finger connectors 72 in parallel with signal contacts on all the electronic devices 82. Separate ones of the burn-in board signal edge finger connectors 72 are connected to separate contacts on a respective one of the electronic devices 82. Some signal traces (not shown) are also connected individually to individual output pins, typically one or two pins, of the electronic devices 82 to give a pass/fail result for each device individually.

Figure 4:
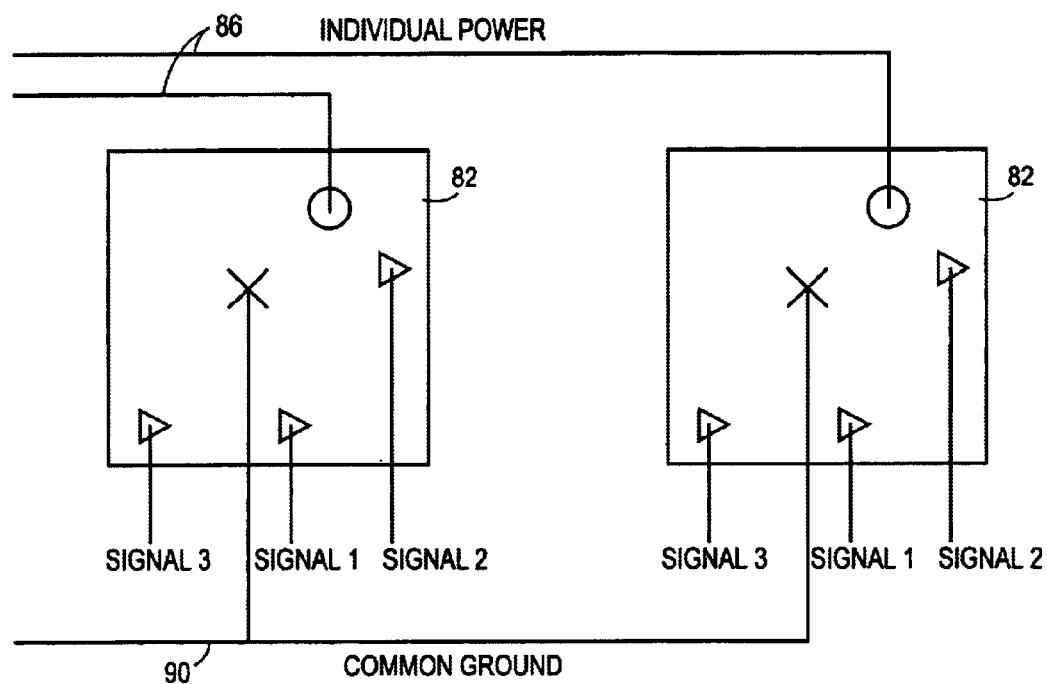
FIG. 4 is a top plan view illustrating contact layouts on two of the electronic devices.

FIG. 4 illustrates the contact layout on two of the electronic devices 82. It can be seen that the contact layouts are identical. Both electronic devices 82 have power contacts at the same locations, and individual power current is provided to each electronic device 82. Both electronic devices 82 have ground contacts at the same locations, and a common ground is provided to both electronic devices 82. Both electronic devices 82 also have signal contacts at the same locations. A first signal (Signal 1) is provided to the same locations on the electronic devices 82. Similarly, a second signal (Signal 2) is provided to the same locations on both electronic devices 82, and a third signal (Signal 3) is provided to the same locations on both electronic devices 82.

Feedthrough Assembly

Figure 5:
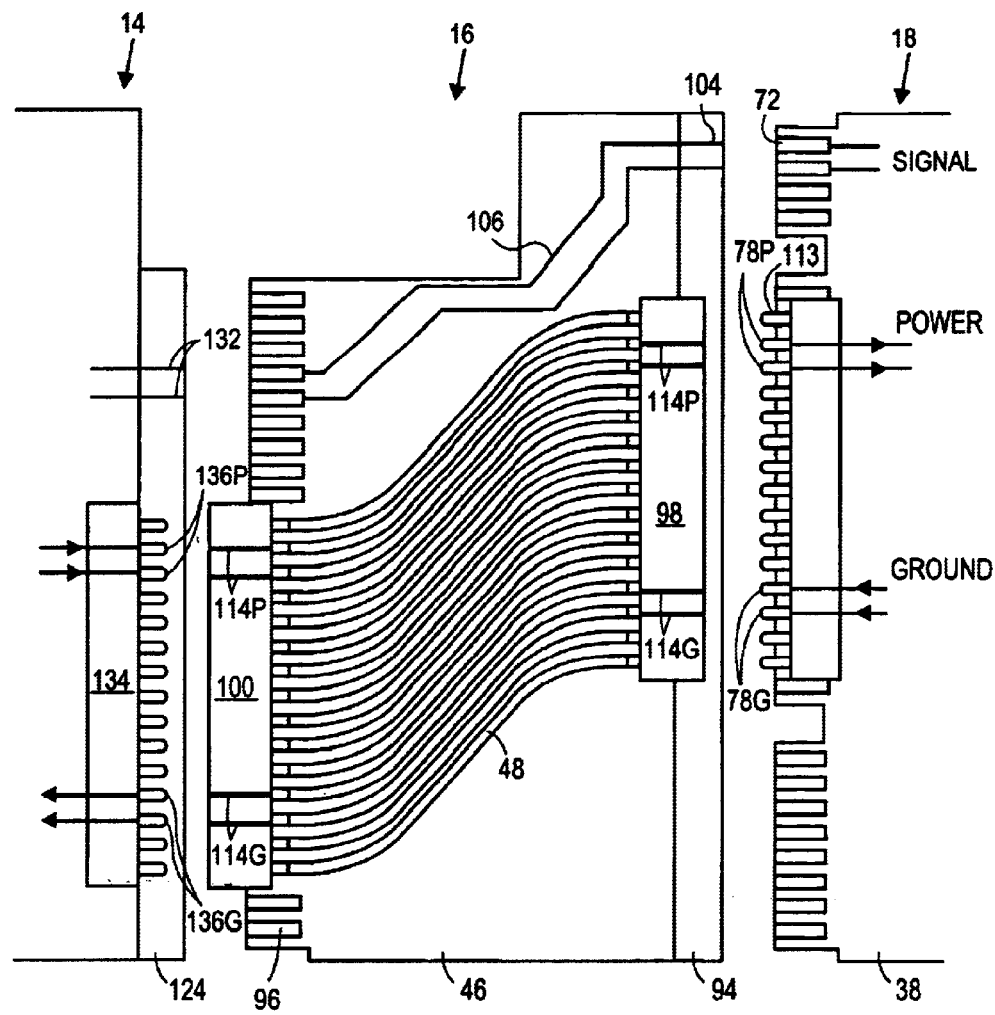
FIG. 5 is a top plan view illustrating a portion of the burn-in board assembly, and further illustrating a feedthrough assembly and a portion of a burn-in testing driver board assembly forming part of the system.
Figure 6:
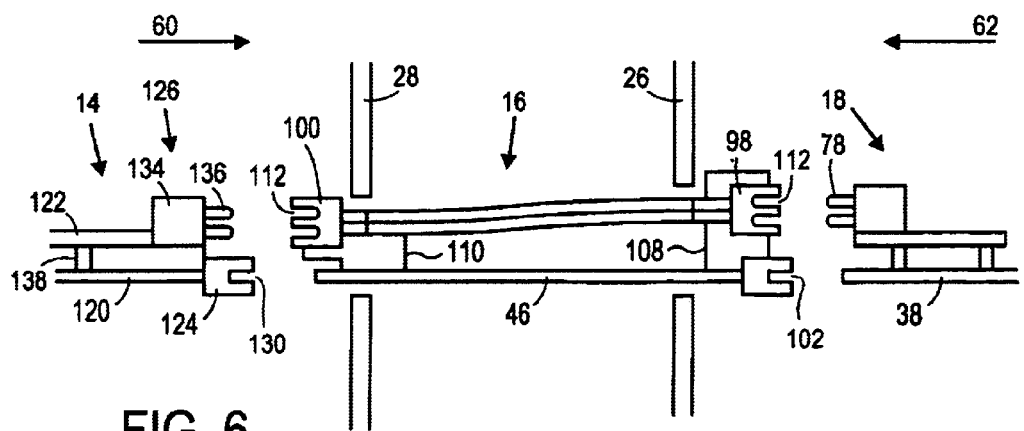
FIG. 6 is a side view of the components or portions of components illustrated in FIG. 5.

Referring now to FIGS. 5 and 6, each feedthrough assembly 16, in addition to its feedthrough board 46 and feedthrough cables 48, further includes a feedthrough edge finger connector block 94, feedthrough edge fingers 96, and right and left feedthrough socket blocks 98 and 100, respectively.

The feedthrough edge finger connector block 94 is mounted to a right-hand edge of the feedthrough board 46. The feedthrough edge fingers 96 are all on upper and lower surfaces near a left edge of the feedthrough board 46. The feedthrough edge finger connector block 94 has a slot 102 formed therein. Feedthrough signal contacts 104 are formed on inner surfaces of the slot 102. Each one of the feedthrough edge fingers 96 is capable of carrying maximum direct current having a magnitude of either 3 A or 5 A. A plurality of signal traces 106 is formed on the feedthrough board 46. Each trace 106 connects a respective one of the feedthrough signal contacts 104 independently to a respective one of the feedthrough edge fingers 96. Some of the signal contacts 104 are also shorted together, to give higher current.

The right feedthrough socket block 98 is mounted through an intermediate component 108 to the feedthrough board 46, and is positioned slightly above the feedthrough edge finger connector block 94. The left feedthrough socket block 100 is mounted through an intermediate component 110 to the feedthrough board 46, and is located above some of the feedthrough edge fingers 96. Each socket block 98 and 100 has a plurality of circular cylindrical openings 112 formed therein. Each circular cylindrical opening 112 is defined by a circular cylindrical conductive contact 114 (FIG. 5) within the respective socket block 98 or 100.

Each one of the cables 48 has one end attached to the right feedthrough socket block 98 and an opposing end attached to the left feedthrough socket block 100. Each respective cable 48 also connects a respective one of the conductive contacts 114 in the right feedthrough socket block 98 with a respective conductive contact 114 in the left feedthrough socket block 100.

As previously mentioned with reference to FIG. 1, the burn-in board assembly 18 is moved in an insertion direction 62. Movement of the burn-in board assembly 18 in the insertion direction 62 moves each one of the burn-in board conductor pins 78P and 78G into a respective one of the circular cylindrical openings 112 in the right feedthrough socket block 98. The edge of the burn-in board substrate 38 carrying the burn-in board signal edge finger connectors 72 enters the slot 102 shortly before the burn-in board conductor pins 78 begin to enter the circular cylindrical openings 112 for purposes of controlling insertion force of the edge into the slot 102. There are two additional alignment pins 116 that engage first. The additional alignment pins are mechanical only, and do not carry any current. Further movement of the burn-in board assembly 18 in the insertion direction 62 causes further movement of the burn-in board conductor pins 78 into the circular cylindrical openings 112 while the burn-in board signal edge finger connectors 72 move into the slot 102. A respective surface of each one of the burn-in board signal edge finger connectors 72 then contacts a respective surface of each one of the feedthrough signal contacts 104. A conductive circular cylindrical outer surface 113 of each one of the burn-in board conductor pins 78 also contacts a respective one of the circular cylindrical conductive contacts 114 in the right feedthrough socket block 98. A respective one of the feedthrough edge fingers 96 is then individually connected to a respective one of the burn-in board signal edge finger connectors 72.

A respective one of the circular cylindrical conductive contacts 114 in the left feedthrough socket block 100 is also individually connected to a respective one of the burn-in board conductive pins 78P and 78G. The circular cylindrical conductive contacts 114 in both feedthrough socket blocks 98 and 100 can be divided into two groups. The first group consists of the conductive contacts 114P that are connected to the burn-in board power conductor pins 78P. Each one of the conductive contacts 114P in the left feedthrough socket block 100 can be used to provide power current individually to each respective one of the electronic devices. The second group consists of the conductive contacts 114G that are connected to the burn-in board ground conductive pins 78G, to provide ground to the electronic devices.

The conductive contacts 114P and 114G can all carry maximum direct current having a magnitude of 10 A. An advantage of connecting the conductive contacts 114P and 114G with the cables 48 as opposed to, for example, traces, is that cables create less noise due to passive parameters associated with them. The cables 48 minimize voltage drop, since cables have lower resistance than traces on a circuit board. This is increasingly important as the absolute value of the nominal voltage decreases, especially below 1 V.

Driver Board Assembly

FIGS. 5 and 6 also illustrate a portion of one of the driver board assemblies 14. The components of the driver board assembly 14 that are shown include a driver substrate 120, a driver power board 122, a driver edge finger connector block 124, and a driver power/ground connector 126.

The driver edge finger connector block 124 is secured to an edge of the driver substrate 120. The driver edge finger connector block 124 has a slot 130 in a side thereof. Driver signal connectors 132 (FIG. 5) are located within the slot 130.

The driver power/ground connector 126 includes a driver power/ground connector block 134 and a plurality of driver connector pins 136 secured to the driver power/ground connector block 134. The driver power/ground connector block 134 is secured to the driver power board 122, and the driver power board 122 is secured through an intermediate component 138 to the driver substrate 120.

As previously mentioned with reference to FIG. 1, the driver board assembly 14 is moved in an insertion direction 60. The driver connector pins 136 move into the circular cylindrical openings 112 in the left feedthrough socket block 100. The slot 130 begins to move over an edge of the feedthrough board 46 carrying the feedthrough edge fingers 96 after tips of the connector pins 136 are inserted into the circular cylindrical openings 112 in the left feedthrough socket block 100. Subsequent movement of the driver board assembly 14 in the insertion direction 60 moves the connector pins 136 further into the openings 112, and the slot 130 all the way over the feedthrough edge fingers 96. Each one of the driver signal connectors 132 has a respective surface making contact with a respective surface of a respective one of the feedthrough edge fingers 96. Each one of the connector pins 136 has a conductive circular cylindrical outer surface making contact with a respective one of the circular cylindrical conductive contacts 114 in the left feedthrough socket block 100.

The driver connector pins 136 can be divided into two groups. The first group consists of driver power connector pins 136P that engage with the conductive power contacts 114P of the left feedthrough socket block 100. The second group consists of driver ground contact pins 136G that engage with the conductive ground contacts 114G of the left feedthrough socket block 100. There can be a one-to-one relationship between the number of driver power connector pins 136P and the number of electronic devices, because each one of the driver power connector pins 136P provides power current individually to a respective one of the electronic devices.

Figure 7:
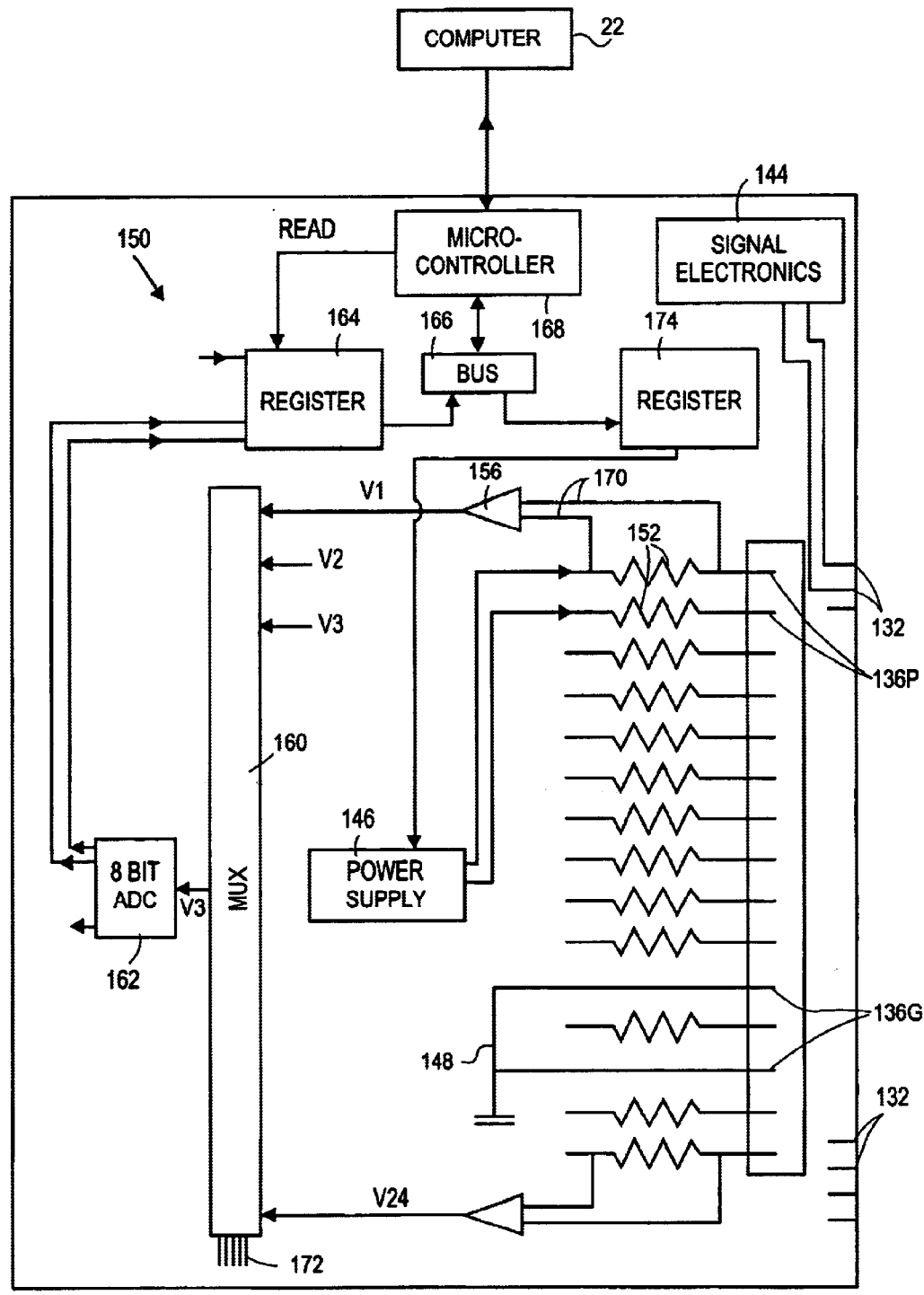
FIG. 7 is a top plan view illustrating further components of the driver board assembly.

FIG. 7 illustrates further components of the driver board assembly 14, including signal electronics 144, a power supply 146, an electric ground 148, and an apparatus 150 for monitoring current provided individually to each electronic device.

The power supply 146 is connected through a respective resistor 152 to a respective one of the driver power connector pins 136P. There is a total of 24 of the resistors 152, one for each electronic device. The driver ground connector pins 136G are all connected to the electric ground 148. Power current can flow at 10 A from the power supply 146 individually through a respective one of the resistors 152 to respective ones of the driver power connector pins 136P, and subsequently individually to respective ones of the electronic devices. Return current can flow at 10 A from the electronic devices through the electric ground 148.

Signal electronics 144 are connected to the driver board signal contacts connectors 132. Individual signals can be provided from the signal electronics 144 individually to respective ones of the driver signal connectors 132. In general, each driver signal connector 132 provides signal current in parallel to the same locations on all the electronic devices (see FIG. 4).

The apparatus 150 includes 24 amplifiers 156, a multiplexer 160, an eight-bit analog-to-digital converter 162, a register 164, a bus 166, and a micro-controller 168.

Each amplifier 156 is connected by two detector lines 170 over a respective one of the resistors 152. A change in current through a respective resistor 152 causes a change in voltage over the respective resistor 152 according to the equation $\Delta V = \Delta IR$. The voltage difference provided through the detector lines 170 to the amplifier 156 thus provides an indication of the magnitude of the current that flows through the respective resistor 152 to the respective electronic device to which the respective resistor 152 is connected.

The amplifier 156 provides linear amplification of the voltage difference detected over the detector lines 170, and provides a voltage output to the multiplexer 160. The voltage output provided by the amplifier 156 to the multiplexer 160 has a magnitude that is indicative of the magnitude of the current flowing through the respective resistor 152. The multiplexer 160 receives a total of 24 voltages (V1, V2, V3, . . . , V24). Each voltage input into the multiplexer 160 has a magnitude that is indicative of a respective current flowing to a respective electronic device.

The multiplexer 160 has an output that is connected to the analog-to-digital converter 162. Five selector lines 172 are connected to the multiplexer 160. Signals through the selector lines 172 allow the multiplexer 160 to select one of the voltages (e.g., V3) which is provided to the analog-to-digital converter 162. Only one of the voltages V1 to V24 is provided to the analog-to-digital converter 162 at a given moment in time, but signals to the selector lines 172 are continually altered to repeatedly step the voltage that is provided to the analog-to-digital converter 162 from V1 to V24.

The analog-to-digital converter 162 converts the voltage received from the multiplexer 160 to eight-bit digital data, and provides the data to the register 164. The digital data held by the register 164 is indicative of the magnitude of the voltage provided by the multiplexer 160 to the analog-to-digital converter 162.

The register 164 is connected through the bus 166 to the microcontroller 168. Other registers 174 may also be connected through the bus 166 to the microcontroller 168. The microcontroller 168 provides a read command to a select one of the registers 164 or 174 in order to control data that is supplied to the bus 166. When a read command is provided to the register 164, the digital data stored in the register 164 is provided through the bus 166 to the microcontroller 168.

The computer system 22 is connected to the microcontroller 168. The microcontroller 168 provides the digital data to the computer system 22. The computer system 22 can be used to monitor and report the digital data and so indirectly monitor the current that is provided to each one of the electronic devices.

A user also programs the computer system 22 with a reference high level and a reference low level for the individual channels. The computer system 22 continually compares the current and measures each of the driver power connector pins 136P with the reference value. The computer system 22 takes no action while the power current in each and every power connector pin 136P is between the reference values. The computer system 22 initiates action when it is detected that the power current through one of the power connector pins 136P exceeds the reference high value or is less than the reference low value. The computer system 22 then sends a command through the microcontroller 168, the bus 166, and the register 174, to the power supply 146. The command sent to the power supply 146 shuts the power supply 146 down. No power current is then provided to any one of the driver power connector pins 136P. A short on one of the electronic devices 82 (FIG. 3) will not cause damage to the electronic device or other components of the burn-in board assembly 18. Such an individual overcurrent detection is very important, because the power supply is rated at 200 A, which is relatively high when compared to earlier systems that are rated around 25 A, which can result in significant damage to the burn-in board in a short condition.

It can thus be seen that the system allows for high power currents to be provided individually to each one of the electronic devices. Current is provided individually to each one of the electronic devices, and is individually monitored.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A burn-in board assembly, comprising;
   a burn-in board substrate;
   a plurality of burn-in sockets on the burn-in board substrate, each to receive a respective electronic device;
   a plurality of burn-in board signal connectors secured to the burn-in board substrate, each burn-in board signal connector having a surface for releasably mating with a respective surface of a respective signal contact of another assembly upon movement of the burn-in board substrate in an insertion direction and each signal connector being capable of carrying maximum direct current having a first magnitude;
   a plurality of burn-in board signal conductors connecting the burn-in board signal connectors to signal contacts on the devices;
   a plurality of burn-in board power connectors secured to the burn-in board substrate, each burn-in board power connector having a surface for releasably mating with a respective surface of a respective power contact of the other assembly upon said movement of the burn-in board substrate in the insertion direction and each power connector being capable of carrying maximum direct current having a second magnitude which is larger than the first magnitude; and
   a plurality of burn-in board power conductors connecting each burn-in board power connector individually to a respective power contact on a respective one of the devices.

2. The burn-in board assembly of claim 1, wherein the second magnitude is at least 7 A.

3. The burn-in board assembly of claim 1, wherein the second magnitude is at least 1.5 times the first magnitude.

4. The burn-in board assembly of claim 1, wherein the second magnitude is at least 4 A more than the first magnitude.

5. The burn-in board assembly of claim 1, wherein the second magnitude is at least 7 A, at least 1.5 times the first magnitude, and at least 4 A more than the first magnitude.

6. The burn-in board assembly of claim 1, wherein each burn-in board power conductor is capable of carrying maximum direct current of a magnitude which is larger than the first magnitude.

7. The burn-in board assembly of claim 1, wherein the burn-in board signal connectors and the burn-in board power connectors are in two distinct groups.

8. The burn-in board assembly of claim 1, wherein the signal contacts are at the same locations on at least two of the devices and the power contacts are at the same locations on the devices.

9. The driver assembly of claim 1, wherein the burn-in board signal connectors and burn-in board power connectors simultaneously mate with the signal connectors and power connectors, respectively, of the other system when the burn-in substrate is moved in an insertion direction in a plane of the burn-in substrate.

10. The burn-in board assembly of claim 1, wherein the burn-in board power conductors connect at least five of the burn-in board power connectors individually to at least five of the devices.

11. The burn-in board assembly of claim 10, wherein the burn-in board power conductors connect at least 10 of the burn-in board power connectors individually to at least 10 of the devices.

12. The burn-in board assembly of claim 1, wherein movement of the burn-in board substrate in an insertion direction causes engagement of the burn-in board signal connectors with the signal contacts and engagement of the burn-in board power connectors with the power contacts.

13. The burn-in board assembly of claim 12, wherein the burn-in board power connectors are pins and the burn-in board signal connectors are edge fingers on a surface at an edge of the burn-in board substrate.

14. The burn-in board assembly of claim 1, wherein the burn-in board signal connectors and the burn-in board power connectors are different types of connectors.

15. The burn-in board assembly of claim 14, wherein the burn-in board signal connectors are edge fingers.

16. The burn-in board assembly of claim 15, wherein the surface of each burn-in board power connector is cylindrical.

17. The burn-in board assembly of claim 16, wherein the surface of each burn-in board power connector is circular cylindrical.

18. The burn-in board assembly of claim 16, wherein each burn-in board power connector is a respective pin.

19. The burn-in board assembly of claim 15, further comprising:

a burn-in board power connector block, the burn-in board power connectors being secured to the burn-in board power connector block, and the burn-in board power connector block being secured to the burn-in board substrate independent from the burn-in board signal connectors.

20. The burn-in board assembly of claim 19, further comprising:

a burn-in board daughter card, the burn-in board power connector being secured to the burn-in board daughter card and the burn-in board daughter card being secured to the burn-in board substrate independent from the burn-in board signal connectors.

21. The burn-in board assembly of claim 20, wherein portions of the burn-in board power conductors form traces, the traces spreading from one another from the burn-in board power connectors to locations where the burn-in board power conductors leave the burn-in board daughter card.

22. The burn-in board assembly of claim 21, wherein the traces spread by at least 25%.

23. A burn-in board assembly, comprising;

a burn-in board substrate;

a plurality of burn-in sockets on the burn-in board substrate, each to receive a respective electronic device;

a plurality of burn-in board signal edge finger connectors on a surface at an edge of the burn-in board substrate, each burn-in board signal edge finger connector having a surface for releasably mating with a respective surface of a respective signal contact of another assembly upon movement of the burn-in board substrate in an insertion direction;

a plurality of burn-in board signal conductors connecting the burn-in board signal edge finger connectors to signal contacts on the devices;

a plurality of burn-in board power connectors secured to the burn-in board substrate, each burn-in board power connector having a cylindrical contact surface for releasably mating with a respective surface of a respective power contact of the other assembly upon said movement of the burn-in board substrate in the insertion direction; and a plurality of burn-in board power conductors connecting each burn-in board power connector to power contacts on the devices.

24. The burn-in board assembly of claim 23, wherein the cylindrical contact surfaces are circular cylindrical contact surfaces.

25. The burn-in board assembly of claim 23, wherein the burn-in board power connectors are pins.

26. The driver assembly of claim 23, wherein the burn-in board signal connectors and burn-in board power connectors simultaneously mate with the signal connectors and power connectors, respectively, of the other system when the burn-in substrate is moved in an insertion direction in a plane of the burn-in substrate.

* * * * *